(12) United States Patent
Su

(10) Patent No.: US 9,359,190 B2
(45) Date of Patent: Jun. 7, 2016

(54) MEMS PACKAGE STRUCTURE AND METHOD FOR FABRICATING THE SAME

(71) Applicant: Himax Display, Inc., Tainan (TW)

(72) Inventor: Chun-Hao Su, Tainan (TW)

(73) Assignee: Himax Display, Inc., Xinshi Dist., Tainan (TW)

( * ) Notice: Subject to any disclaimer, the term of this patent is extended or adjusted under 35 U.S.C. 154(b) by 0 days.

(21) Appl. No.: 14/320,562

(22) Filed: Jun. 30, 2014

(65) Prior Publication Data

US 2015/0375993 A1 Dec. 31, 2015

(51) Int. Cl.
*B81B 7/00* (2006.01)

(52) U.S. Cl.
CPC ......... *B81B 7/0038* (2013.01); *B81B 2201/042* (2013.01)

(58) Field of Classification Search
CPC ............... H01L 2924/1461; H01L 23/564; B81B 7/0032; B81B 7/0041; B81B 7/09; B81B 7/11; B81B 7/115; B81B 2201/042; B81B 2207/09; B81B 2207/11; B81B 2207/115; B81C 2203/0145; B81C 2203/0118; B81C 2203/019
See application file for complete search history.

(56) References Cited

U.S. PATENT DOCUMENTS

| 6,076,256 A * | 6/2000 | Drake | B82Y 30/00 29/412 |
|---|---|---|---|
| 6,433,411 B1 * | 8/2002 | Degani et al. | 257/678 |
| 7,786,560 B2 * | 8/2010 | Hong | 257/680 |
| 2007/0190691 A1 * | 8/2007 | Humpston et al. | 438/113 |
| 2009/0289349 A1 * | 11/2009 | Novotny et al. | 257/698 |

* cited by examiner

*Primary Examiner* — Yuanda Zhang
*Assistant Examiner* — Michael Carter
(74) *Attorney, Agent, or Firm* — Winston Hsu; Scott Margo

(57) ABSTRACT

A MEMS package structure is disclosed. The MEMS package structure includes a first glass substrate on a micro-electromechanical systems (MEMS) structure, a sealant adhered between the first glass substrate and the MEMS structure; and a first moisture barrier on the sidewalls of the first glass substrate, the sealant, and the MEMS structure.

20 Claims, 2 Drawing Sheets

MEMS PACKAGE STRUCTURE AND METHOD FOR FABRICATING THE SAME

BACKGROUND OF THE INVENTION

1. Field of the Invention

The invention relates to a MEMS package structure and fabrication method thereof, and more particularly, to a MEMS package structure with a moisture barrier.

2. Description of the Prior Art

Micro-electromechanical systems (MEMS) devices include micromachines integrated with electronic microcircuits on substrates. Such devices may form, for example, microsensors or microactuators which operate based on, for example, electromagnetic, electrostrictive, thermoelectric, piezoelectric, or piezoresistive effects. MEMS devices have been formed on insulators or other substrates using microelectronic techniques such as photolithography, vapor deposition, and etching. Recently, MEMS is fabricated using the same types of steps (such as the deposition of layers of material and the selective removal of the layers of material) that are used to fabricate conventional analog and digital complementary metal oxide semiconductor (CMOS) circuits.

It has been noted that conventional MEMS device while being integrated with a substrate, such as glass substrate for example, typically encounter issues such as high temperature and high humidity. As humidity increases, water molecules and moistures in the air tend to enter the device and affect the overall performance of the device. Hence how to improve the current MEMS package structure for blocking moisture has become an important task in this field.

SUMMARY OF THE INVENTION

It is therefore an objective of the present invention to provide a MEMS package structure for resolving aforementioned issues.

According to a preferred embodiment of the present invention, a method for fabricating MEMS package structure is disclosed. The method includes the steps of: providing a micro-electromechanical systems (MEMS) structure; adhering a first glass substrate onto the MEMS structure via a sealant; and coating a moisture barrier on the sidewalls of the first glass substrate, the sealant, and the MEMS structure.

According to another aspect of the present invention, a MEMS package structure is disclosed. The MEMS package structure includes a first glass substrate on a micro-electromechanical systems (MEMS) structure, a sealant adhered between the first glass substrate and the MEMS structure; and a first moisture barrier on the sidewalls of the first glass substrate, the sealant, and the MEMS structure.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
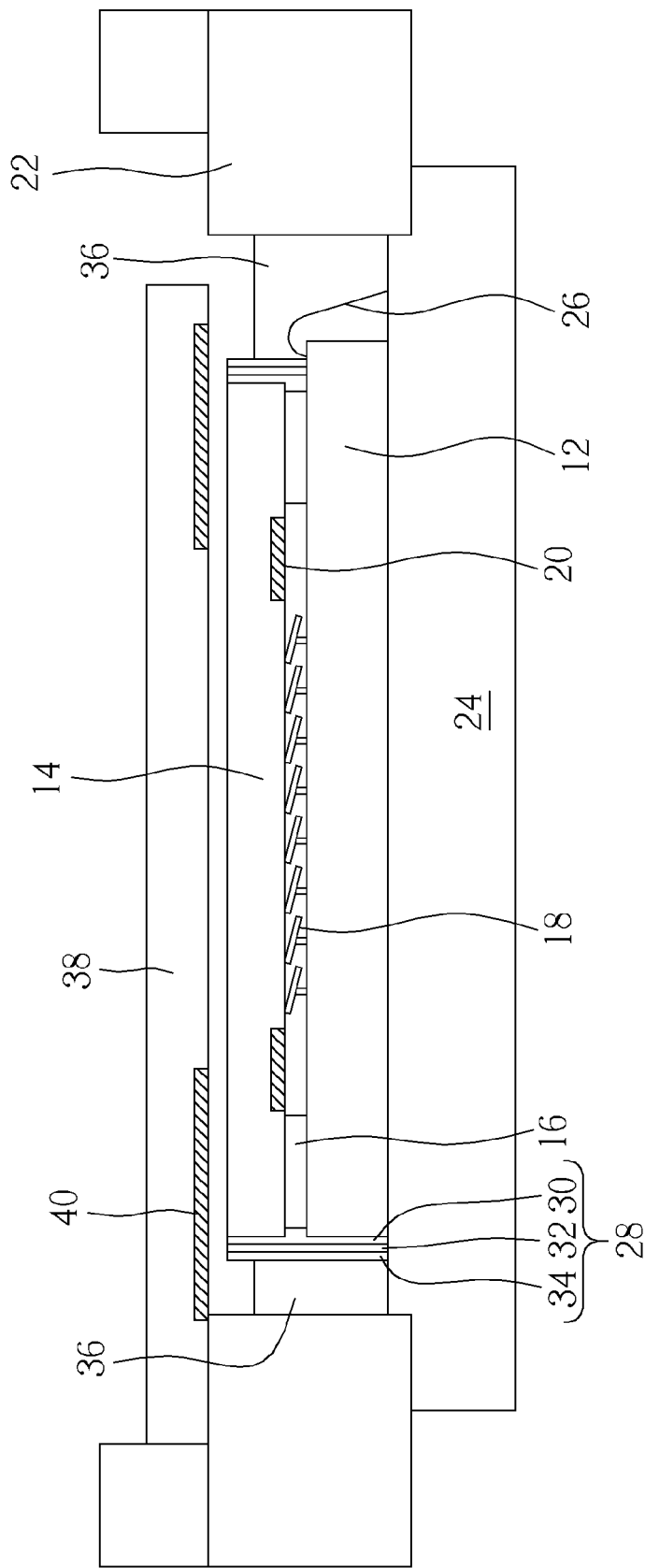
FIG. 1 is a perspective view illustrating a MEMS package structure according to a preferred embodiment of the present invention.

Referring to FIG. 1, FIG. 1 illustrates a method for fabricating MEMS package structure according to a preferred embodiment of the present invention. As shown in FIG. 1, a micro-electromechanical systems (MEMS) structure 12 is first provided, and a first glass substrate 14 is mounted onto the MEMS structure 12 via a sealant 16. In this embodiment, an array of mirrors 18 may be included on a surface of the MEMS structure 12 and a plurality of black matrices 20 are embedded inside the first glass substrate 14 for controlling the direction of light traveled to the mirrors. The sealant 16 is preferably composed of epoxy, but not limited thereto.

While the first glass substrate 14 and the MEMS structure 12 are assembled, a metal frame 22 is adhered onto a substrate 24, in which the substrate 24 is preferably composed of ceramic. The assembly of the first glass substrate 14 and the MEMS structure 12 is then disposed on the substrate 24 and a wire bonding process is carried out to form a plurality of bonding wires 26 and protective encapsulant (not shown) thereon for electrically connecting the MEMS structure 12 and the substrate 24.

After the two assemblies are united, an optional surface treatment could be conducted for generating OH bond on the surface of the first glass substrate 14 and the MEMS structure 12. The surface treatment may include an $O_2$ plasma treatment or a ultraviolet ozone treatment, but not limited thereto.

After plenty of OH bonds are generated on for instance top and side surfaces of the first glass substrate 14 and the MEMS structure 12, a moisture barrier 28 is coated on the sidewalls of the first glass substrate 14, the sealant 16, and the MEMS structure 12. The coating of the moisture barrier 28 may be accomplished by optionally covering the top surface of the first glass substrate 14 with a tape and then performing an atomic layer deposition (ALD) process through the injection of trimethylaluminum and water between 100-150° C. and more preferably at 100° C. to form a moisture resistant layer 30 composed of $AlO_x$ on the sidewalls of the first glass substrate 14, the sealant 16, and the MEMS structure 12. The thickness of the moisture resistant layer 30 is preferably between 5-200 Angstroms.

After the moisture resistant layer 30 is formed, another ALD process is conducted to inject 1,2-Bis(trichlorosilyl)ethane and water between 25-50° C. and more preferably at 35° C. to forma protective layer 32 composed of $SiO_x$ on the moisture resistant layer 28. In addition to ALD process, the formation of the protective layer 32 could also be accomplished by a $SiO_x$ evaporation or sputter process, which are all within the scope of the present invention. The thickness of the protective layer 32 is preferably between 20-200 Angstroms.

Next, a chemical vapor deposition (CVD) process is conducted by applying Octyltriethoxysilane between 25-150° C. to form a water resistant layer 34 composed of self-assembly monolayer (SAM) on the protective layer 32. The thickness of the water resistant layer 34 is preferably between 20-200 Angstroms.

By using the water resistant layer 34 to repel most of the water molecules, using the protective layer 32 to absorb external stress while sustaining the overall shape of the structure, and finally using the moisture resistant layer 30 to block the rest of small moisture molecules from entering the device, the present invention could utilize the moisture barrier 28 containing these three layers 30, 30, 34 to effective stop moisture from affecting elements disposed between the MEMS structure 12 and the first glass substrate 14. For instance, the movement and functionality of the mirrors 18 fabricated on the MEMS structure 12 would be sustained and the overall performance of the device would not be degraded.

It should be noted that despite the aforementioned moisture resistant layer 30, protective layer 32, and water resistant layer 34 are formed in a sequential order, the steps for forming the moisture resistant layer 30 and the protective layer 32 could also be repeated several times before forming the water resistant layer 34, which is also within the scope of the present invention.

In addition, despite the moisture barrier 28 containing the moisture resistant layer 30, protective layer 32, and water resistant layer 34 is coated on the sidewalls of the first glass substrate 14, the sealant 16, and the MEMS structure 12 after the two elements are adhered onto the metal frame 22 and substrate 24 assembly, the coating of the moisture barrier 28 could also be conducted before the first glass substrate 14 and MEMS structure 12 are united with the metal frame 22 and substrate 24 assembly, which is also within the scope of the present invention.

After the two assemblies are united, an optional molding glue 36 could be disposed on the substrate 24 to fill the gap between the moisture barrier 28 and the adjacent metal frame 22, and a second glass substrate 38 is disposed on the metal frame 22 thereafter. This completes the fabrication of a MEMS package structure according to a preferred embodiment of the present invention.

Referring again to FIG. 1, which also reveals a perspective view of a MEMS package structure according to a preferred embodiment of the present invention. The MEMS package structure includes a first glass substrate 14 on a MEMS structure 12, a sealant 16 adhered between the first glass substrate 14 and the MEMS structure 12, and a moisture barrier 28 on the sidewalls of the first glass substrate 14, the sealant 16, and the MEMS structure 12. Preferably, an array of mirrors 18 are fabricated on a surface of the MEMS structure 12 and a plurality of black matrices 20 are formed inside the first glass substrate 14 for controlling the direction of light traveled to the mirrors 18. The sealant 16 is preferably composed of epoxy, but not limited thereto.

The moisture barrier 28 preferably includes a moisture resistant layer 30 on the sidewalls of the first glass substrate 14, the sealant 16, and the MEMS structure 12, a protective layer 32 on the moisture resistant layer 30, and a water resistant layer 34 on the protective layer 32. Preferably, the moisture resistant layer 30 is composed of $AlO_x$ having a thickness between 5-200 Angstroms, the protective layer 32 is composed of $SiO_x$ having a thickness between 20-200 Angstroms, and the water resistant layer 34 is composed of self-assembly monolayer (SAM) having a thickness between 20-200 Angstroms.

The MEMS package structure also includes a metal frame 22 with step-shape adhered onto a substrate 24, and the first glass substrate 14 and the MEMS structure 12 assembly is disposed on the substrate 24. The substrate 24 is preferably composed of ceramic, and an optional molding glue 36 is disposed on the substrate 24 to fill the gap between the moisture barrier 28 and the metal frame 22, and a second glass substrate 38 with black matrices 40 is disposed on the step-shaped portion of the metal frame 22.

Figure 2:
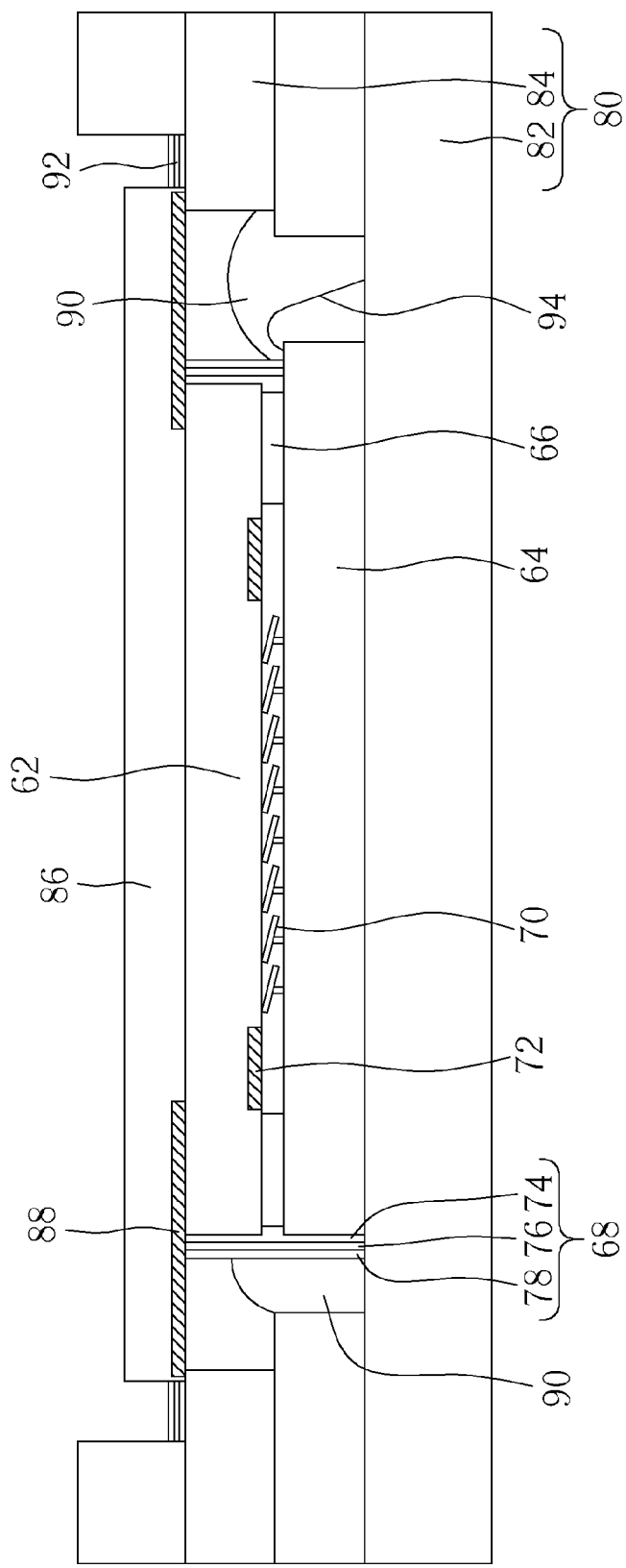
FIG. 2 is a perspective view illustrating a MEMS package structure according to another embodiment of the present invention

Referring to FIG. 2, FIG. 2 is a perspective view illustrating a MEMS package structure according to another embodiment of the present invention. Similar to the aforementioned embodiment, the MEMS package structure includes a first glass substrate 62 on a MEMS structure 64, a sealant 66 adhered between the first glass substrate 62 and the MEMS structure 64, and a first moisture barrier 68 on the sidewalls of the first glass substrate 62, the sealant 66, and the MEMS structure 64. An array of mirrors 70 are fabricated on a surface of the MEMS structure 64 and a plurality of black matrices 72 are formed inside the first glass substrate 62 for controlling the direction of light traveled to the mirrors. The sealant 66 is composed of epoxy, but not limited thereto.

The moisture barrier 68 preferably includes a moisture resistant layer 74 on the sidewalls of the first glass substrate 62, the sealant 66, and the MEMS structure 64, a protective layer 76 on the moisture resistant layer 74, and a water resistant layer 78 on the protective layer 76. Preferably, the moisture resistant layer 74 is composed of $AlO_x$ having a thickness between 5-200 Angstroms, the protective layer 76 is composed of $SiO_x$ having a thickness between 20-200 Angstroms, and the water resistant layer 78 is composed of self-assembly monolayer (SAM) having a thickness between 20-200 Angstroms.

Despite the substrate 80 of this embodiment is also composed of ceramic, the shape of the substrate is 80 redesigned to accommodate the features of both substrate and metal frame so that the metal frame disclosed in the previous embodiment is omitted. Preferably, the substrate 80 includes a base 82 and a step-shaped portion 84 situating on the base 82, in which the two portions 82 and 84 could be formed monolithically. The step-shaped portion 84 of substrate 80 is preferably ring-shaped when viewed from top, and a second glass substrate 86 with black matrices 88 is disposed on the step-shaped portion 84 of the substrate 80 while sealing the gaps between the substrate 80 and the first glass substrate 62.

A plurality of bonding wires 94 is formed to electrically connect the MEMS structure 64 and the base 82 of the substrate 80, and an optional molding glue 90 is disposed on the base 82 of the substrate 80 to fill the gap between the moisture barrier 68 and the step-shaped portion 84, and another moisture barrier 92 could be formed in the gap between the second glass substrate 86 and the step-shaped portion 84 of the substrate 80 to further prevent moisture from entering the device. The structural composition and fabrication of the moisture barrier 92 could be the same as the moisture barrier 68 formed on the sidewall of the first glass substrate 62 and the MEMS structure 64, and the details of which are not explained herein for the sake of brevity.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method for fabricating MEMS package structure, comprising:
    providing a micro-electromechanical systems (MEMS) structure
    mounting a first glass substrate onto the MEMS structure via a sealant;
    coating a moisture barrier on the sidewalls of the first glass substrate, the sealant, and the MEMS structure, wherein the moisture barrier comprises a self-assembly monolayer (SAM); and
    forming a molding glue on the moisture barrier such that the moisture barrier is between the molding glue and the sealant.

2. The method of claim 1, further comprising:
    adhering a metal frame onto a substrate;
    disposing the first glass substrate and MEMS structure onto the metal frame and the substrate; and
    disposing a second glass substrate on the metal frame.

3. The method of claim 2, wherein the sealant comprises epoxy and the substrate comprises a ceramic substrate.

4. The method of claim 1, wherein the step of coating the moisture barrier comprises:
    (a) forming a moisture resistant layer on the sidewalls of the first glass substrate, the sealant, and the MEMS structure;

(b) forming a protective layer on the moisture resistant layer; and (c) forming a water resistant layer on the protective layer.

5. The method of claim 4, wherein the moisture resistant layer comprises $AlO_x$.

6. The method of claim 4, wherein the protective layer comprises $SiO_x$.

7. The method of claim 4, wherein the water resistant layer comprises the self-assembly monolayer (SAM).

8. The method of claim 4, further comprising repeating steps (a) and (b) before performing step (c).

9. The method of claim 4, further comprising performing an atomic layer deposition (ALD) process for forming the moisture resistant layer and the protective layer.

10. The method of claim 4, further comprising performing a chemical vapor deposition (CVD) process for forming the water resistant layer.

11. The method of claim 1, further comprising performing a surface treatment on the surface of the first glass substrate and the MEMS structure for generating OH bond before coating the moisture barrier.

12. The method of claim 11, wherein the surface treatment comprises an $O_2$ plasma treatment or a ultraviolet ozone treatment.

13. A MEMS package structure, comprising:
a first glass substrate on a micro-electromechanical systems (MEMS) structure;
a sealant adhered between the first glass substrate and the MEMS structure;
a first moisture barrier on the sidewalls of the first glass substrate, the sealant, and the MEMS structure, wherein the first moisture barrier comprises a self-assembly monolayer (SAM); and
a molding glue on the first moisture barrier such that the first moisture barrier is between the molding glue and the sealant.

14. The MEMS package structure of claim 13, further comprising:
a metal frame adhered onto a substrate;
the first glass substrate and the MEMS structure on the substrate; and
a second glass substrate on the metal frame.

15. The MEMS package structure of claim 13, further comprising:
a substrate having a base and a step-shaped portion on the base;
the first glass substrate and the MEMS structure on the base of the substrate and enclosed by the step-shaped portion; and
a second glass substrate on the step-shaped portion of the substrate.

16. The MEMS package structure of claim 15, further comprising a second moisture barrier between the second glass substrate and the step-shaped portion of the substrate.

17. The MEMS package structure of claim 13, wherein the first moisture barrier comprises:
a moisture resistant layer on the sidewalls of the first glass substrate, the sealant, and the MEMS structure;
a protective layer on the moisture resistant layer; and
a water resistant layer on the protective layer.

18. The MEMS package structure of claim 17, wherein the moisture resistant layer comprises $AlO_x$.

19. The MEMS package structure of claim 17, wherein the protective layer comprises $SiO_x$.

20. The MEMS package structure of claim 17, wherein the water resistant layer comprises the self-assembly monolayer (SAM).

* * * * *